United States Patent
Bhatia

(12) 
(10) Patent No.: US 6,724,669 B1
(45) Date of Patent: Apr. 20, 2004

(54) SYSTEM AND METHOD FOR REPAIRING A MEMORY COLUMN

(75) Inventor: Ajay Bhatia, Fort Lee, NJ (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 10/142,822

(22) Filed: May 8, 2002

(51) Int. Cl.[7] .................................................. G11C 7/00

(52) U.S. Cl. .................................. 365/200; 365/189.02

(58) Field of Search ............................ 365/200, 189.02

(56) References Cited

U.S. PATENT DOCUMENTS 4,462,091 A * 7/1984 Knepper et al. ............ 365/200

* cited by examiner

Primary Examiner—Huan Hoang
(74) Attorney, Agent, or Firm—Baker Botts L.L.P.

(57) ABSTRACT

A system for repairing a memory column includes a multiplexer operable to receive a first data bit and a second data bit. The multiplexer is operable to select one of the first data bit and the second data bit. The system also includes a control generator operable to receive a control signal indicating an error in the first data bit. The control generator is operable to generate a select signal, and the multiplexer is operable to select the second data bit in response to the select signal.

20 Claims, 3 Drawing Sheets

SYSTEM AND METHOD FOR REPAIRING A MEMORY COLUMN

TECHNICAL FIELD OF THE INVENTION

The present invention relates in general to memory storage and more particularly to a system and method for repairing a memory column.

BACKGROUND OF THE INVENTION

Virtually any device that utilizes an electronic circuit requires the ability to store information in a memory storage device. Traditional circuit designs may include embedded memories or cache memories. Manufacturing defects occur in the memories due to imperfect processing which results in permanently damaged bits. One approach to repair defective memory bits is a design with an extra redundant memory column/row in the memory array. The defective column/row is found by testing of the wafer. Repair of a defective column/row is performed by replacing the defective column/row with the redundant column/row. This is achieved by reading a data bit from memory into a sensing amplifier and then pass it through a full-swing two input multiplexer. The other input of the multiplexer is redundant. The multiplexer only outputs the data bit received from memory if the memory column/row is not defective. This multiplexer configuration prevents data errors from being communicated to the rest of the circuit. A second approach to error correction involves two data storage arrays. Data is stored in a first array and a second array is filled with redundant data bits. Upon discovering a defective bit in the first array, the redundant bit from the second array may be used to replace the erroneous bit. Both of these approaches, however, consume a large amount of circuit area and circuit power and introduce substantial time delays into the circuit. Therefore, it is desirable to efficiently correct errors in memory devices.

SUMMARY OF THE INVENTION

From the foregoing, it may be appreciated by those skilled in the art that a need has arisen for a method of repairing a memory using a low power multiplexer that causes no time delay. In accordance with the present invention a system and method for repairing a memory column is provided that substantially eliminates or greatly reduces disadvantages and problems associated with conventional memory repair techniques.

According to one embodiment of the present invention, there is provided a system and method for repairing a memory column. The system includes a multiplexer operable to receive a first data bit and a second data bit. The multiplexer is operable to select one of the first data bit and the second data bit. The system also includes a control generator operable to receive a control signal indicating an error in the first data bit. The control generator is operable to generate a select signal, and the multiplexer is operable to select the second data bit in response to the select signal.

The present invention provides various technical advantages over conventional memory repair techniques. For example one technical advantage is to replace defective bits in a memory storage device without causing circuit timing delays. Another technical advantage is to prevent errors in data bit storage from being passed throughout a circuit in a space-saving and energy efficient manner. Yet another technical advantage is the ability to perform local bit switching without the need to perform global bit switching in tandem. Other technical advantages may be readily ascertainable by those skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figures 1, 2:
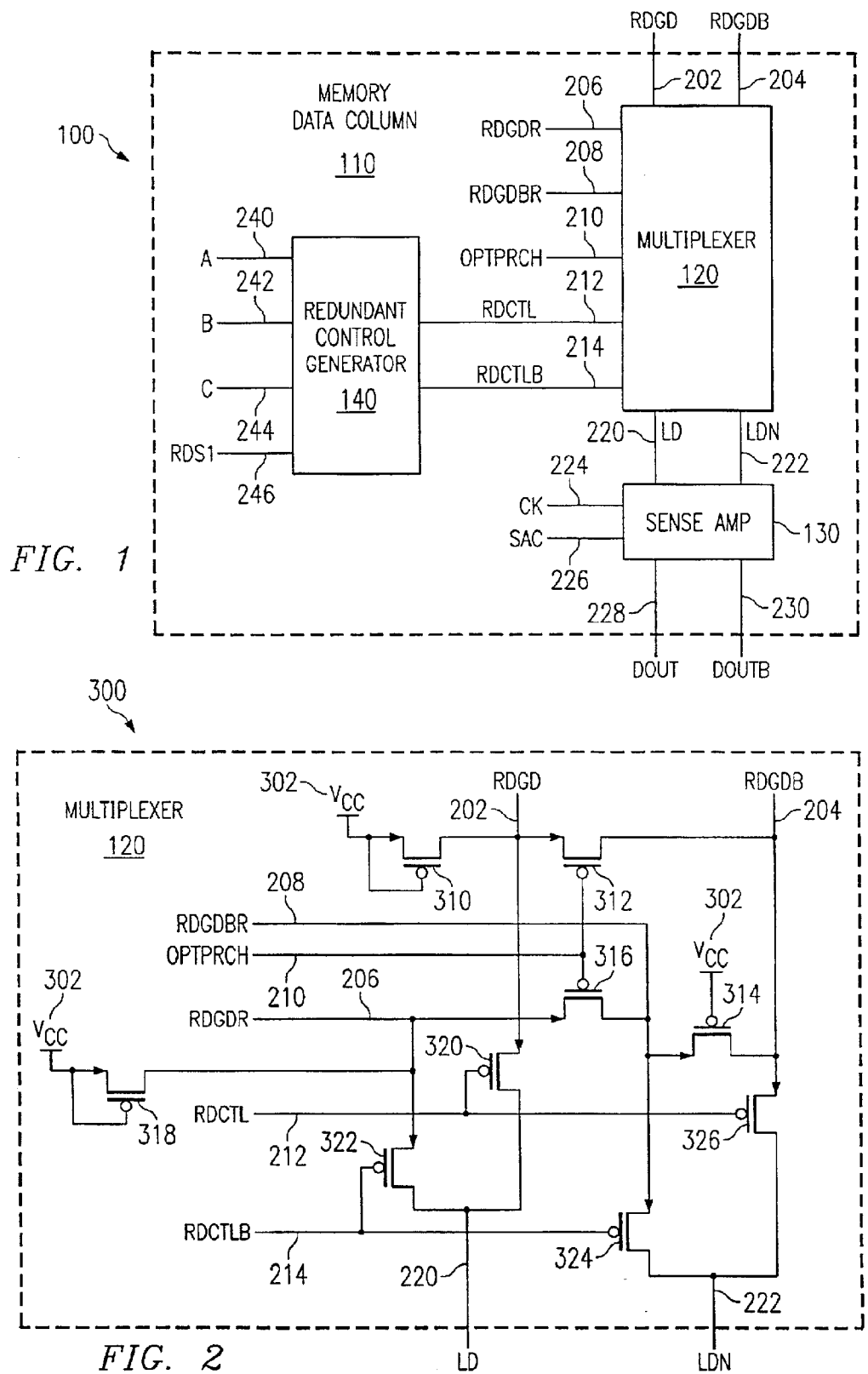
FIG. 1 illustrates a block diagram of a memory repair system.
FIG. 2 illustrates a schematic diagram of a multiplexer in the memory repair system.

Referring to FIG. 1, there is illustrated a block diagram of a memory repair system 100 in one embodiment of the present invention. System 100 includes a plurality of memory data columns of which a memory data column 110 is shown. Individual memory data columns 110 are combinable in various configurations to form memory caches or other types of embedded memories that are operable to store data. Each memory data column 110 includes electronic circuitry for repairing mistakes made in data storage. Such repair circuitry may include a multiplexer (mux) 120, a sensing amplifier (SenseAmp) 130, and a Redundant Control Generator (RCG) 140. In one embodiment of the present invention, the repair circuitry is implemented in the low-swing read path of a global bit line wherein mux 120 is implemented to function as a low swing pass gate. While mux 120, SenseAmp 130, and RCG 140 may be implemented as separate circuit components, it is envisioned that the functions of one or more of these components may also be incorporated into one circuit component within the scope of the present invention.

Mux 120 receives global data bit inputs RDGD 202 and RDGDB 204 from storage in memory data column 110. In addition, mux 120 is operable to receive inputs RDGDR 206 and RDGDBR 208, which are redundant data bits for global inputs RDGD 202 and RDGDB 204. Inputs RDGDR 206 and RDGDBR 208 may be received from data bit inputs RDGD 202 and RDGDB 204 of another or adjacent memory data bit column 110. Mux 120 is further operable to receive OPTPRCH 210, an optional pre-charge signal for a data bit line selected by mux 120. RDCTL 212 and RDCTLB 214 comprise a pair of control line signals from RCG 140 to mux 120 and are operable to control the switching of mux 120. The operation of RCG 140 and generation of control line signals RDCTL 212 and RDCTLB 214 will be considered below in greater detail.

Mux 120 outputs a data bit pair at LD 220 and LDN 222. The data bit pair is input into SenseAmp 130. SenseAmp 130 is operable to receive a clock signal CK 224 as well as a SenseAmp Clock (SAC) signal 226. Signals 224 and 226 connect SenseAmp 130 to the global circuit timing system. A pair of data bits are output from SenseAmp 130 at DOUT 228 and DOUTB 230. Outputs DOUT 228 and DOUTB 230 communicate the data bits retrieved from memory data column 110 to the rest of the circuit.

Redundant Control Generator (RCG) 140 is operable to receive and process four inputs to generate mux control signals RDCTL 212 and RDCTLB 214. Inputs A 240, B 242, and C 244 are input from fuses (not shown) and are operable to inform RCG 140 which, if any, of the data bits stored in memory data column 110 are in error. The fourth input, RDSI 246, informs RCG 140 what was done during a previous data bit operation so that mux 120 may be controlled accordingly. The switching operations within mux 120 will be described below in further detail.

Referring now to FIG. 2, there is illustrated a mux 120 according to one embodiment of the present invention. A voltage, $V_{cc}$ 302, is provided to make the circuit operational. $V_{cc}$ 302 is supplied to both the gate and source inputs of a Positive-channel Metal Oxide Semiconductor (PMOS) 310. The drain output of PMOS 310 is connected to the global data bit input RDGD 202. RDGD 202 is also connected to the source input of a PMOS 312. The gate input of PMOS 312 is connected to OPTPRCH 210, while the drain output of PMOS 312 is connected to global data bit input RDGDB 204. Global data bit input RDGDB 204 is also connected to the drain output of PMOS 314. The gate input of PMOS 314 is connected to $V_{cc}$ 302, while the source input of PMOS 314 is connected to the redundant data bit input RDGDBR 208. Redundant data bit input RDGDBR 208 is also connected to the drain output of PMOS 316. The gate input of PMOS 316 is connected to OPTPRCH 210, while the source input of PMOS 316 is connected to the redundant data bit input RDGDR 206. RDGDR 206 is also connected to the drain output of PMOS 318. Both the gate and source inputs of PMOS 318 are connected to $V_{cc}$ 302.

Data bit input RDGD 202 is connected to the source input of PMOS 320. The gate input of PMOS 320 is connected to control line RDCTL 212. The drain output of PMOS 320 is connected to the drain output of PMOS 322, and this circuit path forms output LD 220. The source input of PMOS 322 is connected to redundant bit input RDGDR 206, while the gate input is connected to control line RDCTLB 214. RDCTLB 214 is also connected to the gate input of PMOS 324. The source input of PMOS 324 is connected to redundant bit input RDGDBR 208. The drain output of PMOS 324 is connected to the drain output of PMOS 326, and this circuit path forms output LDN 222. The gate input of PMOS 326 is connected to control line RDCTL 212, while the source input of PMOS 326 is connected to data input bit RDGDB 204.

Mux 120 is operable to receive data bit inputs RDGD 202 and RDGDB 204 from memory data column 110. The circuit is further operable to receive redundant data bit inputs RDGDR 206 and RDGDBR 208. Control signals RDCTL 212 and RDCTLB 214 determine whether mux 120 places the data bits input from memory data column 110 or the redundant data bits onto outputs LD 220 and LDN 222. This switching process will be described below in greater detail.

Figure 3:
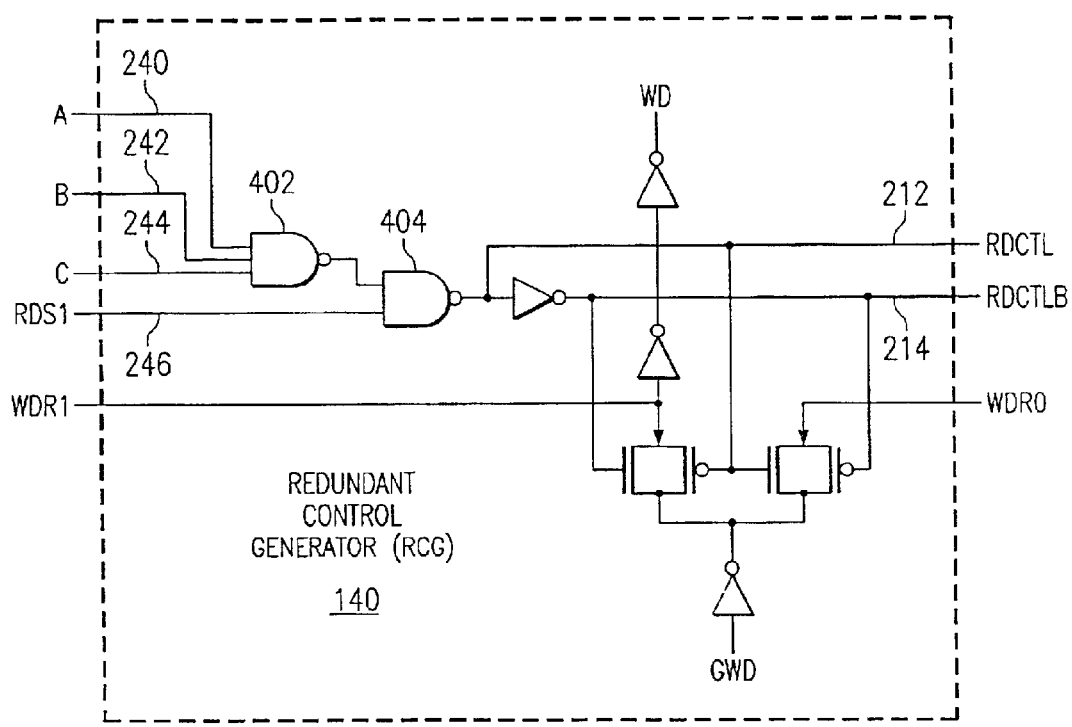
FIG. 3 illustrates a schematic diagram of a redundant control generator in the memory repair system.

Referring now to FIG. 3, there is illustrated in greater detail a control circuit within RCG 140 in one embodiment of the present invention. RCG 140 may receive three inputs, A 240, B 242, and C 244, from fuses (not shown) that are operable to inform RCG 140 which, if any, of the data bits stored in memory data column 110 are erroneous. Inputs A 240, B 242, and C 244 are input into a logical NAND gate 402. Input RDSI 246 communicates information regarding the previous data bit and signals a shift operation if the previous bit was repaired. Input RDSI 246 and the output from NAND gate 402 are input into a second NAND gate 404. The output from NAND gate 404 forms control bit output RDCTL 212. The inverse of the output from NAND gate 404 is output as RDCTLB 214.

The repair process for an erroneous storage of data begins with testing to determine if a memory data column 110 contains an erroneous data bit. Inputs A 240, B 242, and C 244 are input from fuses into RCG 140. An erroneous data bit stored in memory data column 110 will be indicated by blowing the appropriate fuse or fuses. RCG 140 is operable to receive this erroneous data bit information at inputs A 240, B 242, and C 244. Based on the information received, RCG 140 may generate control signals and communicate the control signals to mux 120 over control lines RDCTL 212 and RDCTLB 214.

Figure 4:
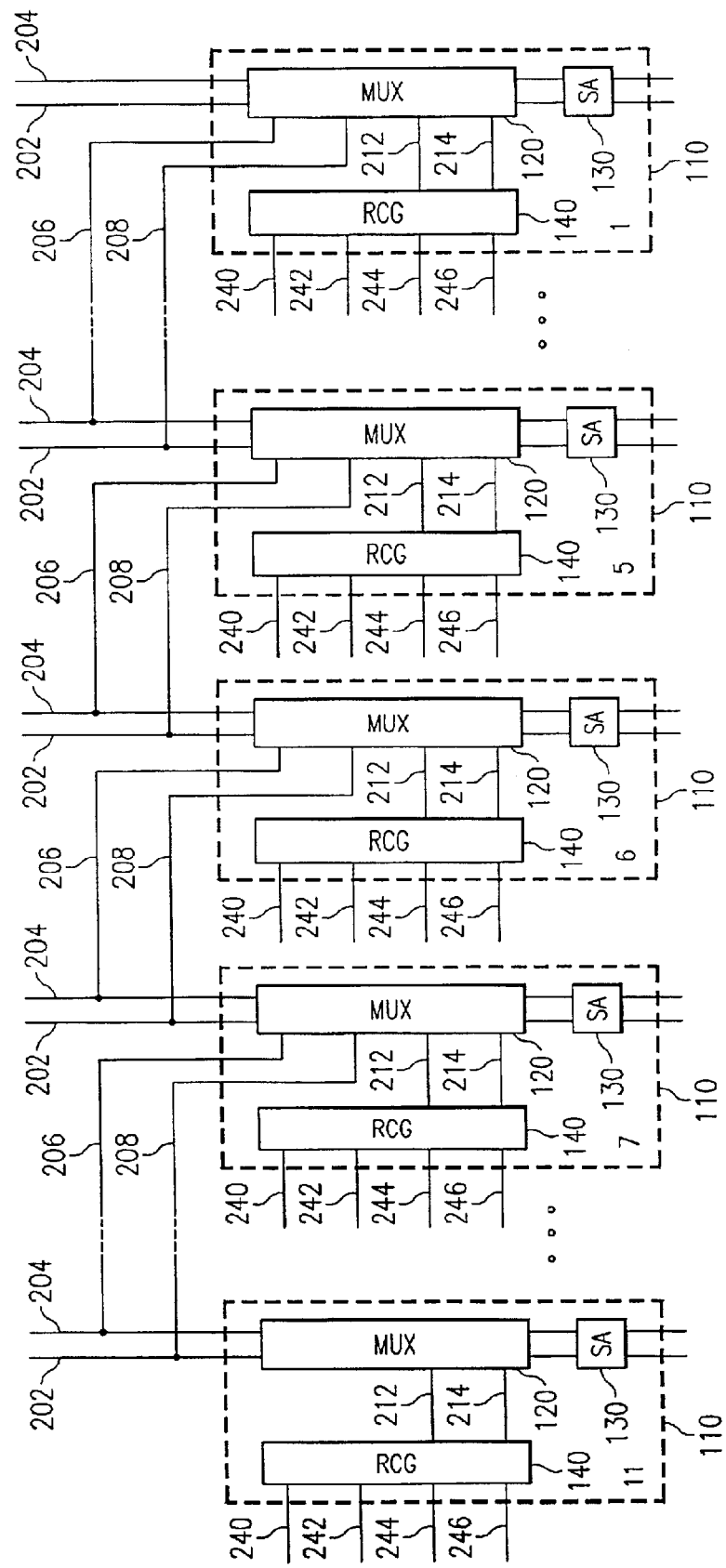
FIG. 4 illustrates an example of a ten bit word memory using the memory repair system.

FIG. 4 shows one embodiment of the present invention, with memory data columns 110 operable to store groups of data as ten-bit data words. For each ten data bits stored in memory data columns 110, there is an eleventh memory data column 110 that provides a redundancy in case of failure in any one of the ten memory data columns 110. Memory repair system 100 is operable to repair at least one erroneous data bit within a ten-bit data word stored in memory data columns 110. In operation when there are no erroneous data bits, the eleventh memory data column 110 will not be used. The ten-bit data word will be retrieved from the first ten memory data columns 110. When an error is discovered in memory data column 110, however, the eleventh memory data column 110 may be used by memory repair system 100 to replace the erroneous bit. Traditional memory repair systems 100 may require that for a local data bit to be switched, all data bits must also be switched. In one embodiment of the present invention, by contrast, the switching of one bit may not require that a global bit switching operation occur.

An erroneous bit will cause a fuse or fuses to blow, the occurrence of which is communicated to RCG 140 by inputs A 240, B 242, and C 244. Other methods of detecting and communicating an erroneous data bit stored in memory data column 110 may be equally used by one skilled in the art. It is envisioned that these methods are also within the scope of the present invention. RCG 140 processes the information and instructs mux 120 how to respond over control lines RDCTL 212 and RDCTLB 214. In one embodiment of the present invention, mux 120 may be a ratio 2:1 mux, meaning that for two sets of inputs, RDGD 202 and RDGDB 204 or RDGD 208 and RDGDBR 210, mux 120 is operable to mask out one set of inputs and output a selected set of inputs. Mux 120 is thus implemented as a redundant logical device as it is operable to mask an erroneous data bit stored in memory data column 110 with a redundant data bit to prevent passing incorrect data bits to the rest of the circuit. When inputs RDGD 202 and RDGDB 204 represent a correct data bit input, mux 120 will mask redundant inputs RDGDR 208 and RDGDBR 210.

By way of example, a scenario is considered wherein a ten-bit data word stored in memory data columns 110 is to be retrieved. In the example, the fifth memory data column 110 has an error, but the present invention is operable to detect an error in any data bit of the data bit word. At a first memory data column 110, the first data bit is received by mux 120 at inputs RDGD 202 and RDGDB 204 and mux 120 also receives redundant data bit information at inputs RDGDR 206 and RDGDBR 208. Inputs RDGDR 206 and RDGDBR 208 are received from a second memory data column 110. Inputs A 240, B 242, and C 244 will inform RCG 140 that the data bit received at RDGD 202 and RDGDB 204 is correct. After this determination, RCG 140 generates control signals RDCTL 212 and RDCTLB 214 to instruct low swing mux 120 to output the low swing data bit received at inputs RDGD 202 and RDGDB 204 and disregard the inputs received at RDGDR 206 and RDGDBR 208. This procedure will be repeated for subsequent data bits within the ten-bit word until RCG 140 detects an incorrect data bit. In this example scenario the first four data bits are correct. Accordingly, four data bits stored in each memory data column 110 are output by mux 120 from global bit inputs RDGD 202 and RDGDB 204 to outputs LD 220 and LDN 222.

Continuing with the example scenario, the fifth data bit of the ten-bit data word is in error. The error in the fifth data bit is detected by RCG 140 and the control lines RDCTL 212 and RDCTLB 214 will instruct mux 120 of the fifth memory data column 110 to output the sixth data bit received from the sixth memory data column 110 at redundant inputs RDGDR 206 and RDGDBR 208. In this situation, mux 120 will receive the erroneous fifth data bit at input pair RDGD 202 and RDGDB 204 in addition to the sixth data bit at redundant inputs RDGDR 206 and RDGDBR 208. Control signals RDCTL 212 and RDCTLB 214 will instruct mux 120 to output the sixth data bit onto outputs LD 220 and LDN 222, rather than the erroneous fifth data bit. For the remainder of the memory read of the ten-bit word, input RDSI 246 is operable to communicate to RCG 140 in each memory data column 110 that a repair of the fifth bit occurred, thus indicating that the sixth bit replaced the fifth bit. Accordingly, for the next bit operation, RDSI 246 will inform RCG 140 that the previous bit was repaired, and RCG 140 will instruct mux 120 to input the appropriate data bit at redundant inputs RDGDR 205 and RDGDBR 208. In the subsequent data bit input operation at the sixth memory data column 110, mux 120 will receive the sixth bit at RDGD 202 and RDGDB 204 and the seventh bit at RDGDR 206 and RDGDBR 208 from the seventh memory data column 110. RCG control signals RDCTL 212 and RDCTLB 214 for the sixth memory data column 110 instruct mux 120 to output the seventh data bit onto its outputs LD 220 and LDN 222 rather than repeat the sixth data bit. This replacement process is repeated for the subsequent data bits in the ten bit word until mux 120 of the tenth memory data column 110 outputs a tenth data bit that was input from the eleventh memory data column 110 at redundant bit inputs RDGDR 206 and RDGDBR 208. The outputs LD 220 and LDN 222 of each memory data column 110 are output from a corresponding mux 120 and are input into a corresponding SenseAmp 130. SenseAmp 130 is operable to amplify the data and begin driving long wires in the remainder of the electric circuit.

In one embodiment of the present invention, the critical speed path may be faster and less circuit surface area may be required to output the data word from memory data column 110 than is required by traditional circuit designs. Mux 120 is implemented in the low swing read path, because the data retrieved from the memory data column 110 has not yet been passed through SenseAmp 130. Since a memory read is accomplished low swing, mux 120 will have a minimal effect on overall circuit timing. Mux 120 may also be operable to receive an optional pre-charging input, OPT-PRCH 210. This signal may be used to pre-charge selected bit lines. Pre-charging increases the speed with which mux 120 may switch between bit inputs and may reduce any delay that mux 120 adds to overall circuit timing. In addition since most memory storage devices are comprised of a plurality of memory data columns 110, and every data bit retrieved from a memory data column 110 is processed by multiplexer 120, the low swing embodiment of a plurality of multiplexers 120 of the present invention may result in an overall lower power consumption by the circuit.

Other traditional methods of multiplexing data bits from a memory data column may include implementing a "full swing" multiplexer after the data bits have been amplified by a sensing amplifier. This method degrades overall circuit speed, however, because delays occur in converting the low swing read into a full swing read. Circuit area is also wasted, because a larger driver component is required to drive the full-swing multiplexer than is required for low-swing mux 120. In one embodiment of the present invention, the area needed for column repair circuitry is decreased as there is no buffer required. Removal of the buffer component results in a lower overall circuit power consumption.

Another traditional method for memory repair may be implemented using two data storage sub-arrays. A first data storage sub-array is filled with data bits while a second sub-array is filled with redundant data bits. Upon discovering a data bit error in the first sub-array, the appropriate redundant bit from the second sub-array is used to replace the incorrect bit. Two data storage sub-arrays, however, consume substantial power and require many circuit connections to cross over each other, thus greatly affecting the energy efficiency of the electronic circuit.

Thus, it is apparent that there has been provided, in accordance with the present invention, a system and method for repairing a memory column that satisfies the advantages set forth above. Although the present invention has been described in detail, it should be understood that various changes, substitutions, and alterations may be readily ascertainable by those skilled in the art and may be made herein without departing from the spirit and scope of the present invention as defined by the following claims.

What is claimed is:

1. A system for repairing a memory column, comprising:
    a multiplexer operable to receive a first data bit and a second data bit, the second data bit being adjacent to the first data bit in a memory data word, the multiplexer operable to select one of the first data bit and the second data bit; and
    a control generator operable to receive a control signal indicating an error in the first data bit, the control generator operable to generate a select signal, the multiplexer operable to select the second data bit in response to the select signal.

2. The system of claim 1, wherein the multiplexer is in a low swing read path of the memory column.

3. The system of claim 1, wherein the second data bit is received from another memory column.

4. The system of claim 1, further comprising:
    a sense amplifier operable to drive the selected one of the first and second data bits onto a signal line.

5. The system of claim 1, wherein the control generator is operable to generate a pre-charge signal, the pre-charge signal operable to pre-charge the selected one of the first and second data bits.

6. A method for repairing a memory column, comprising:
    receiving a first data bit;
    receiving a second data bit, the second data bit being adjacent to the first data bit in a memory data word;
    a determining whether the first data bit is erroneous;
    generating a select signal in response to the first data bit being erroneous; and
    selecting the second data bit for output in response to the select signal.

7. The method of claim 6, further comprising:
    amplifying the second data bit.

8. The method of claim 6, further comprising:

pre-charging the second data bit.

9. The method of claim 6, further comprising:

selecting the first data bit in response to the first data bit not being erroneous.

10. The method of claim 6, wherein the first data bit is associated with a first memory column and the second data bit is associated with a second memory column.

11. The method of claim 6, wherein the first data bit and the second. data bit are received in a low swing read path.

12. A system for repairing a memory column, comprising:

a first memory column operable to receive a stored first data bit; and a second memory column operable to receive a stored second data bit, the second data bit being adjacent to the first data bit in a memory data word, the second memory column operable to provide the second data bit to the first memory column, the first memory column operable to select one of the first data bit and the second data bit.

13. The system of claim 12, wherein the first memory column is operable to determine whether the first data bit is in error, the first data column operable to select the second data bit in response to the first data bit being in error.

14. The system of claim 13, wherein the second memory column is operable to receive a third data bit from a third memory column, the second memory column operable to select the third data bit in response to the first data bit being in error.

15. The system of claim 14, wherein the second memory data column is operable to receive a control signal indicating that the first data bit is in error.

16. The system of claim 12, wherein the first memory column includes a multiplexer operable to receive the first data bit and the second data bit, the multiplexer being in a low swing read path of the first memory data column.

17. The system of claim 16, wherein the first memory column includes a sense amplifier operable to drive the selected one of the first data bit and the second data bit on an output signal line.

18. The system of claim 16, wherein the first memory column includes a control generator operable to provide a select signal to the multiplexer for selection of one of the first data bit and the second data bit.

19. The system of claim 18, wherein the control generator is operable to receive a control signal indicating the first data bit is in error.

20. The system of claim 12, wherein the first and second data columns are part of a ten bit memory design.

* * * * *